United States Patent
Ohba et al.

(10) Patent No.: US 9,761,796 B2
(45) Date of Patent: *Sep. 12, 2017

(54) STORAGE DEVICE AND STORAGE UNIT WITH ION SOURCE LAYER AND RESISTANCE CHANGE LAYER

(71) Applicant: SONY CORPORATION, Tokyo (JP)

(72) Inventors: Kazuhiro Ohba, Tokyo (JP); Hiroaki Sei, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/647,793

(22) PCT Filed: Nov. 6, 2013

(86) PCT No.: PCT/JP2013/079983
§ 371 (c)(1),
(2) Date: May 27, 2015

(87) PCT Pub. No.: WO2014/087784
PCT Pub. Date: Jun. 12, 2014

(65) Prior Publication Data
US 2015/0318471 A1  Nov. 5, 2015

(30) Foreign Application Priority Data

Dec. 3, 2012 (JP) .................. 2012-264168
Jul. 5, 2013 (JP) .................. 2013-141685

(51) Int. Cl.
G11C 11/00 (2006.01)
H01L 45/00 (2006.01)
(Continued)

(52) U.S. Cl.
CPC .......... *H01L 45/08* (2013.01); *G11C 13/0007* (2013.01); *G11C 13/0009* (2013.01);
(Continued)

(58) Field of Classification Search
CPC ... H01L 45/085; H01L 27/2472; H01L 45/04; H01L 45/1233; H01L 27/2436;
(Continued)

(56) References Cited

U.S. PATENT DOCUMENTS 6,784,509 B2 * 8/2004 Yuasa ............... B82Y 10/00
257/421
8,450,715 B2 * 5/2013 Takano ............ H01L 45/1616
257/3
(Continued)

FOREIGN PATENT DOCUMENTS

JP  2005-322942 A  11/2005
JP  2006-196537 A   7/2006
(Continued)

OTHER PUBLICATIONS

Rainer Waser, Regina Dittmann, Georgi Staikov, and Kristof Szot. "Redox-Based Resistive Switching Memories-Nonoionic Mechanisms, Prospects, and Challenges." 2009 WILEY-VCH Verlag GmbH & Co. KGaA, Weinheim. Adv. Mater. 2009, 21, 2632-2663.

*Primary Examiner* — David Lam
(74) *Attorney, Agent, or Firm* — Chip Law Group

(57) ABSTRACT

There are provided a storage device and a storage unit capable of improving retention performance of an intermediate resistance value in writing at a low current, and a storage device and a storage unit capable of reducing random telegraph noise. A storage device of one embodiment of the present technology includes a first electrode, a storage layer, and a second electrode in this order, and the storage layer includes: an ion source layer including one or more kinds of chalcogen elements selected from tellurium (Te), sulfur (S), and selenium (Se), and one or more kinds of transition metal elements selected from Group 4 elements, Group 5 elements, and Group 6 elements of the periodic table; and a resistance change layer including boron (B) and oxygen (O). A storage device of another embodiment of the present technology includes the above-described ion source layer and a resistance change layer including one or more kinds of transaction metal elements selected from Group 4 elements, Group 5 elements, and Group 6 elements of the periodic table, and oxygen (O).

17 Claims, 6 Drawing Sheets

(51) Int. Cl.
 *G11C 13/00* (2006.01)
 *H01L 27/24* (2006.01)
(52) U.S. Cl.
 CPC ........ *G11C 13/0069* (2013.01); *H01L 45/085* (2013.01); *H01L 45/1233* (2013.01); *H01L 45/145* (2013.01); *G11C 13/0004* (2013.01); *G11C 2213/35* (2013.01); *G11C 2213/56* (2013.01); *H01L 27/2436* (2013.01); *H01L 27/2472* (2013.01)
(58) Field of Classification Search
 CPC ... H01L 45/145; H01L 45/08; H01L 45/1253; G11C 13/0007; G11C 13/0069; G11C 13/0002; G11C 2213/32; G11C 13/0004; G11C 2213/56; G11C 13/0009
 USPC .......... 365/148, 163, 158; 257/3–5, E45.002
 See application file for complete search history.

(56) References Cited

U.S. PATENT DOCUMENTS 8,547,735 B2 * 10/2013 Mizuguchi ............ H01L 45/145
 365/148
2015/0349025 A1 * 12/2015 Sei ...................... H01L 45/1233
 257/4

FOREIGN PATENT DOCUMENTS

| JP | 2009-218260 A | 9/2009 |
| JP | 2012-146368 A | 8/2012 |
| JP | 2012-182172 A | 9/2012 |

* cited by examiner

[ FIG. 1 ]
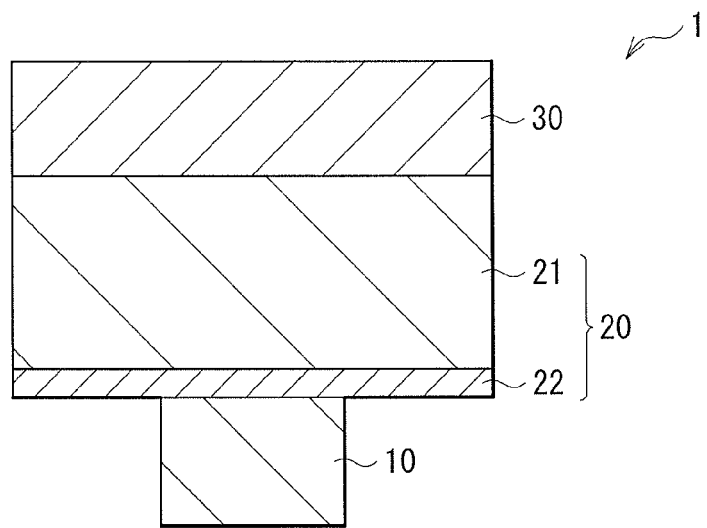

[FIG. 2]
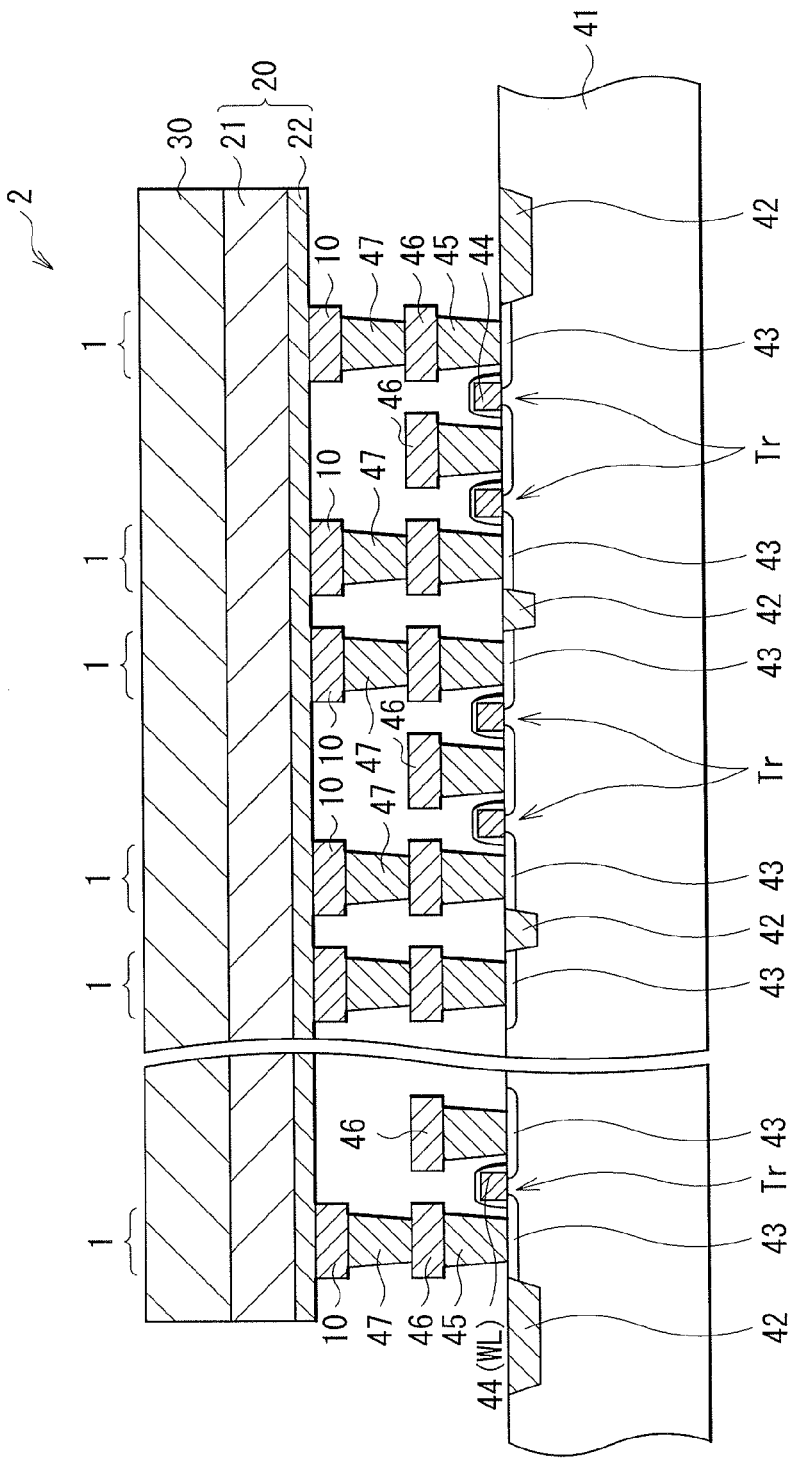

[ FIG. 3 ]
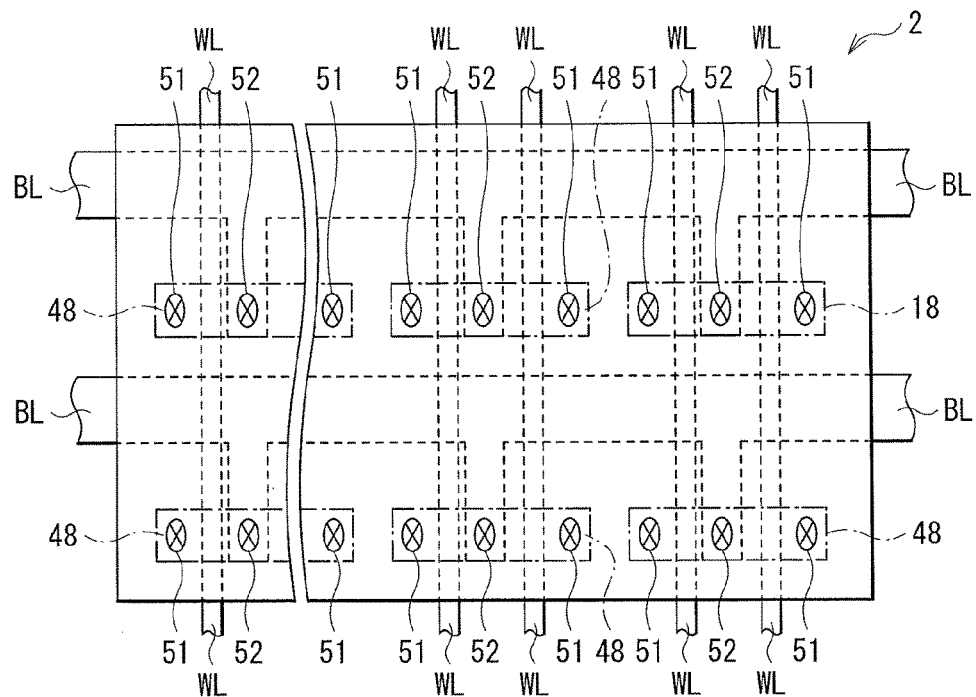
[ FIG. 4 ]
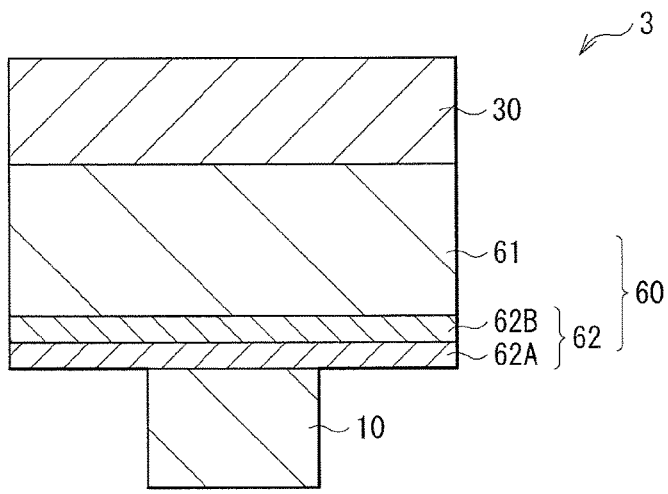

[ FIG. 5 ]
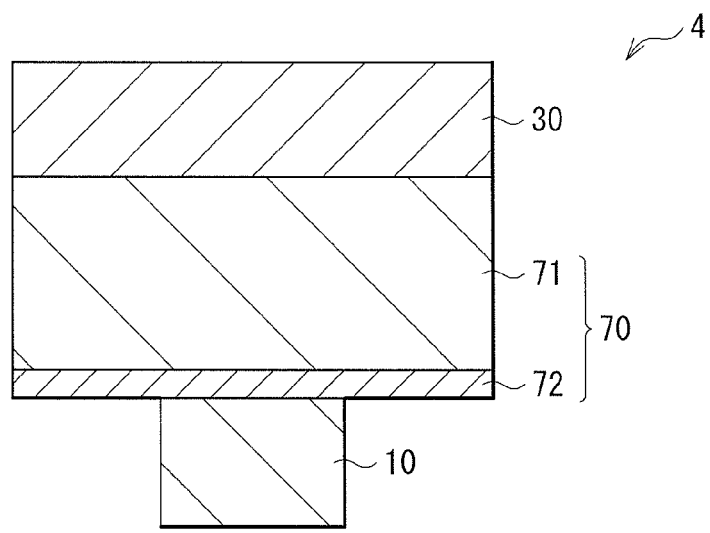
[ FIG. 6 ]
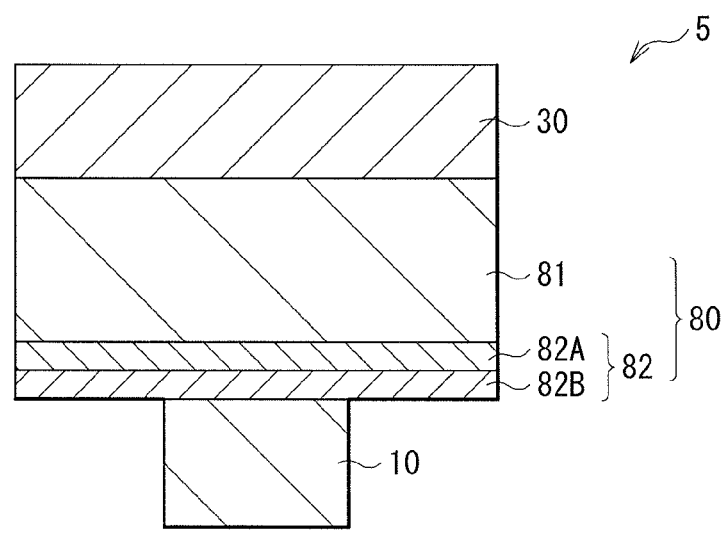

[ FIG. 7 ]
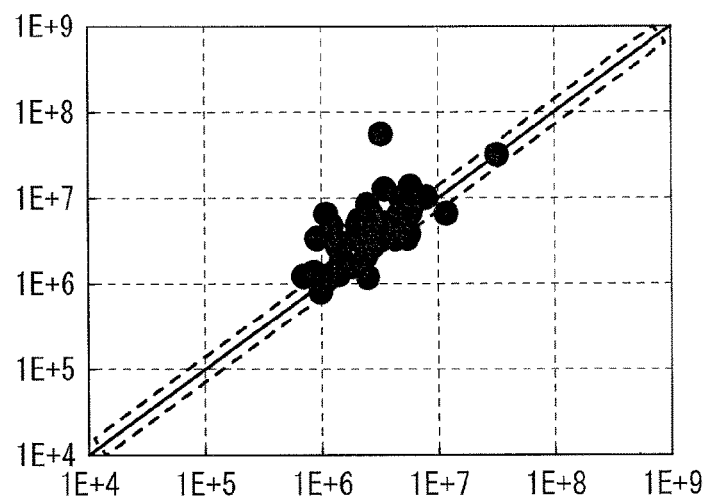
[ FIG. 8 ]
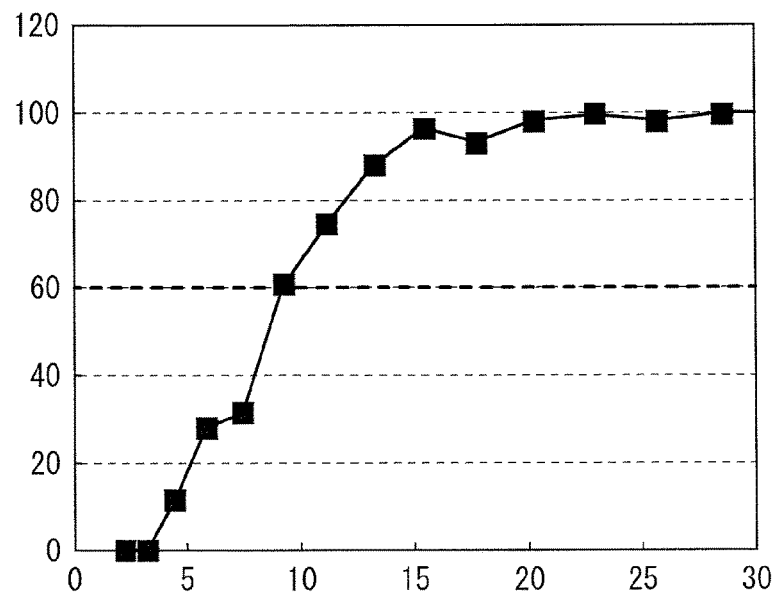

[ FIG. 9 ]
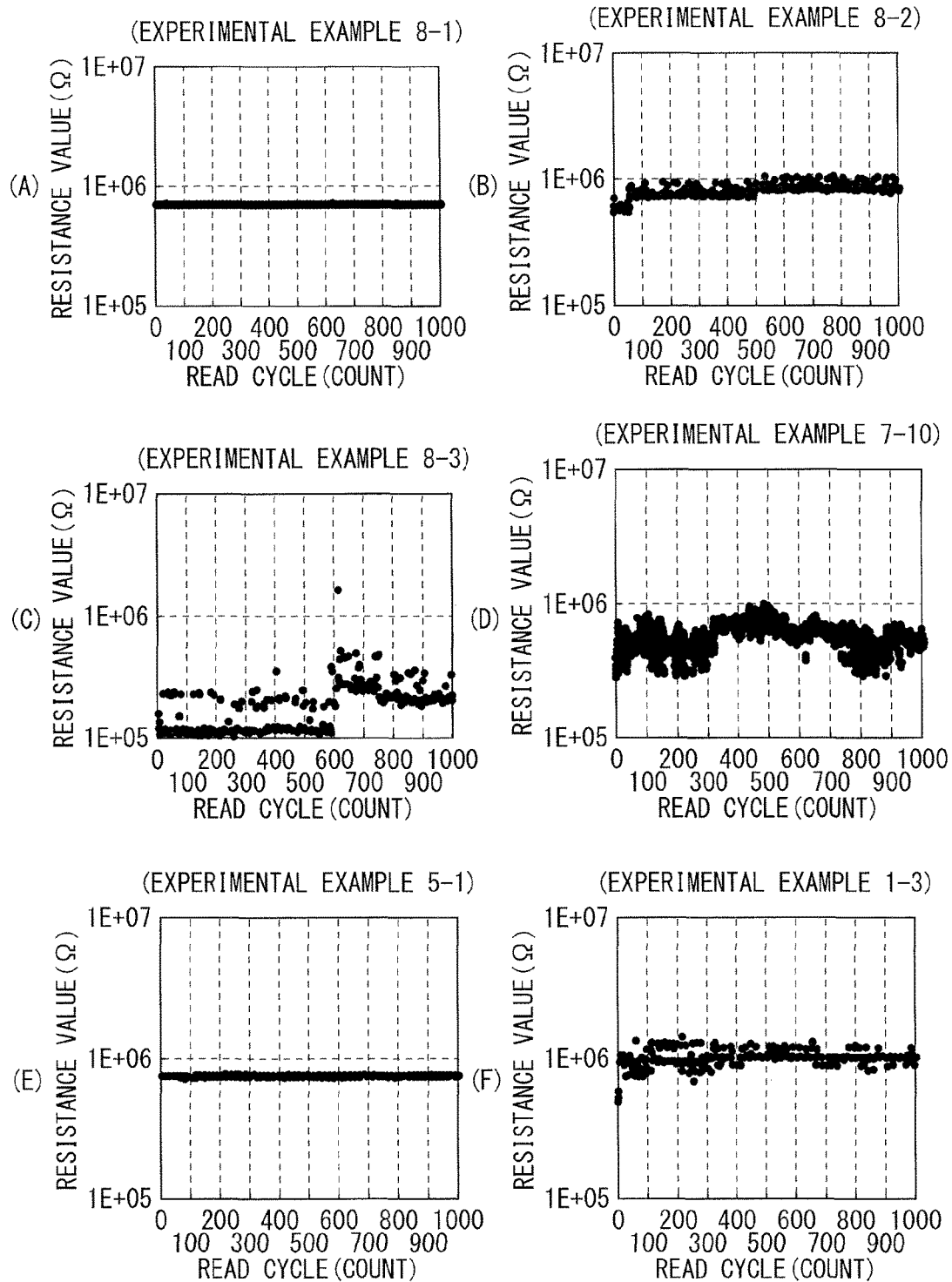

STORAGE DEVICE AND STORAGE UNIT WITH ION SOURCE LAYER AND RESISTANCE CHANGE LAYER

CROSS-REFERENCE TO RELATED APPLICATION

The present application is a national phase entry under 35 U.S.C 371 of International Application No. PCT/JP2013/079983 filed Nov. 6, 2013, published on Dec. 6, 2014 as WO2014/087784 A1, which claims priority from Japanese Patent Application No. JP 2012-264168 and JP2013-141685 respectively filed in the Japanese Patent Office on Dec. 3, 2012, and Jul. 5, 2013.

TECHNICAL FIELD

The present disclosure relates to a storage device and a storage unit that hold information by change in electrical characteristics of a storage layer including an ion source layer.

The present disclosure relates to a storage device and a storage unit that hold information by change in electrical characteristics of a storage layer including an ion source layer.

BACKGROUND ART

NOR or NAND flash memories have been typically used as semiconductor nonvolatile memories for data storage. These semiconductor nonvolatile memories have achieved an increase in capacity by miniaturizing memory devices and drive transistors; however, since a high voltage is necessary for writing and erasing, and the number of electrons that are to be injected into a floating gate is limited, limitations in miniaturization has been pointed out.

At present, resistance change memories such as ReRAMs (Resistance Random Access Memories) and PRAMs (Phase Change Random Access Memories) have been proposed as next-generation nonvolatile memories that are capable of transcending the limitations in miniaturization (for example, refer to PTL 1 and NPTL 1). These memories have a simple configuration in which a resistance change layer is provided between two electrodes, and it is considered that atoms or ions are moved by heat or an electric field to form a conductive path, and thus a resistance value of the resistance change layer is changed, thereby performing writing and erasing. More specifically, there has been proposed a storage device using a transition metal element, a chalcogen element, and copper (Cu) that tends to cause ion conduction (for example, refer to PTL 2).

In addition to miniaturization of the memories as described above, multi-valuing of memories is another method of achieving an increase in capacity of memories that perform writing and erasing by resistance change. When multi-valuing of the memories, i.e. multi-value recording of 2 bits (4 values), 3 bits (8 values), or the like per device is enabled, the capacity is increased twofold or threefold.

CITATION LIST

Patent Literature

PTL 1: Japanese Unexamined Patent Application Publication No. 2006-196537 PTL 2: Japanese Unexamined Patent Application Publication No. 2005-322942

Non-Patent Literature

NPTL 1: Waser et al., Advanced Material, 21, p2932 (2009)

SUMMARY OF INVENTION

To achieve multi-valuing, it is necessary to perform writing when the resistance value of the resistance change layer is at a level (an intermediate resistance value) between a low resistance state and a high resistance state, and it is necessary to retain the intermediate resistance value. However, since the above-described storage device does not have sufficient thermal and chemical stability, it is difficult to retain the intermediate resistance value for a long time. Moreover, an oxygen defect formed in writing tends to be repeatedly generated and disappear, and as a result, there is an issue that resistance variation (random telegraph noise) is likely to occur in every reading. This is because charge deviation around the oxygen defect is difficult to stably exist.

Therefore, it is desirable to provide a storage device and a storage unit that are capable of improving retention performance of an intermediate resistance value in writing at a low current. Moreover, it is desirable to provide a storage device and a storage unit that are capable of reducing random telegraph noise.

A storage device of one embodiment of the present technology is provided with a first electrode, a storage layer, and a second electrode the first electrode, the storage layer, and the second electrode are provided in this order, and the storage layer includes: an ion source layer including one or more kinds of chalcogen elements selected from tellurium (Te), sulfur (S), and selenium (Se), and one or more kinds of transition metal elements selected from Group 4 elements, Group 5 elements, and Group 6 elements of the periodic table; and a resistance change layer including boron (B) and oxygen (O).

A storage device of another embodiment of the present technology is provided with a first electrode, a storage layer, and a second electrode, the first electrode, the storage layer, and the second electrode are provided in this order, and the storage layer includes: an ion source layer including one or more kinds of chalcogen elements selected from tellurium (Te), sulfur (S), and selenium (Se), and one or more kinds of transition metal elements selected from Group 4 elements, Group 5 elements, and Group 6 elements of the periodic table; and a resistance change layer including one or more kinds of transaction metal elements selected from Group 4 elements, Group 5 elements, and Group 6 elements of the periodic table, and oxygen (O).

In the storage devices of the embodiments of the present technology, when a voltage pulse or a current pulse is applied to the device in an initial state (a high resistance state) in a "positive direction" (for example, a negative potential on the first electrode side and a positive potential on the second electrode side), the metal element (for example, the transition metal element) included in the ion source layer is ionized to be diffused into the storage layer (for example, into the resistance change layer), or oxygen ions move, thereby generating an oxygen defect in the resistance change layer. Therefore, a low resistance section (a conductive path) in a low oxidation state is formed in the storage layer, thereby decreasing the resistance of the resistance change layer (a recording state). When a voltage pulse is applied to the device in the low resistance state in a "negative direction" (for example, a positive potential on the first electrode side and a negative potential on the second electrode side), metal ions in the resistance change layer move into the ion source layer, or oxygen ions move from the ion source layer, thereby decreasing the oxygen defect in a conductive path portion. Accordingly, the conductive path including the metal element disappears, and the resistance of the resistance change layer is turned to a high resistance state (an initial state or an erasing state).

A storage unit of one embodiment of the present technology is provided with a plurality of storage devices and a pulse application means, each of the storage devices includes a first electrode, a storage layer, and a second electrode in this order, the pulse application means is configured to selectively apply a pulse of a voltage or a current to the plurality of storage devices, and the storage device of the embodiment of the present technology is used as each of the storage devices.

A storage unit of another embodiment of the present technology is provided with a plurality of storage devices and a pulse application means, each of the storage devices includes a first electrode, a storage layer, and a second electrode in this order, the pulse application means is configured to selectively apply a pulse of a voltage or a current to the plurality of storage devices, and the storage device of the other embodiment of the present technology is used as each of the storage devices.

In the storage device of the one embodiment of the present technology or the storage unit of the one embodiment of the present technology, as constituent materials of the resistance change layer, boron (B) and oxygen (O) are used to form a bond between O and B, thereby improving thermal and chemical stability of the conductive path.

In the storage device of the other embodiment of the present technology or the storage unit of the other embodiment of the present technology, the chalcogen element and the Group 4, 5, and 6 transition metal elements in the periodic table are used for the ion source layer, and as with the ion source layer, the Group 4, 5, and 6 transition metal elements in the periodic table are used for the resistance change layer. Therefore, charge deviation around an oxygen defect formed in writing is stabilized.

According to the storage device of the one embodiment of the present technology or the storage unit of the one embodiment of the present technology, boron (B) and oxygen (O) are used as constituent materials of the resistance change layer. Accordingly, a bond between B and O with large binding energy is formed, and thermal and chemical stability of the conductive path is improved. Therefore, retention performance of an intermediate resistance value in writing at a low current of the resistance change layer is allowed to be improved.

According to the storage device of the other embodiment of the present technology or the storage unit of the other embodiment of the present technology, the chalcogen element with a large relative dielectric constant is used for the ion source layer, and the ion source layer and the resistance change layer each include a metal element of a same kind (Group 4, 5, and 6 transition metal elements in the periodic table). Therefore, charge deviation around an oxygen defect formed in writing is allowed to be stabilized, and random telegraph noise is allowed to be reduced.

BRIEF DESCRIPTION OF DRAWINGS

FIG. 1 is a sectional view illustrating a configuration of a storage device according to an embodiment of the present disclosure.

FIG. 2 is a sectional view illustrating a configuration of a memory cell array using the storage device in FIG. 1.

FIG. 3 is a plan view of the same memory cell array.

FIG. 4 is a sectional view illustrating a storage device according to Modification Example 1 of the present disclosure.

FIG. 5 is a sectional view illustrating a configuration of a storage device according to another embodiment of the present disclosure.

FIG. 6 is a sectional view illustrating a storage device according to Modification Example 2 of the present disclosure.

FIG. 7 is a characteristic diagram illustrating changes in resistance value before and after a temperature accelerated retention test in Experimental Example 1 of the present disclosure.

FIG. 8 is a characteristic diagram of a writing current and a retention success rate as criteria for judging an experiment result of the present disclosure.

FIG. 9 is a characteristic diagram illustrating variation in resistance value in reading in Experimental Example 2 of the present disclosure.

DESCRIPTION OF EMBODIMENTS

Some embodiments of the present disclosure will be described in detail below referring to the accompanying drawings in the following order.
1. First Embodiment (An example in which a resistance change layer includes boron (B) and oxygen (O))
 1-1. Storage Device
 1-2. Storage Unit
2. Modification Example 1 (An example in which a resistance change layer has a laminate configuration)
3. Second Embodiment (An example in which an ion source layer and a resistance change layer each include a transition metal element)
4. Modification Example 2 (An example in which a resistance change layer has a laminate configuration)
5. Examples
 (1 First Embodiment)
 (1-1. Storage Device)

FIG. 1 illustrates a sectional configuration of a storage device 1 according to a first embodiment of the present disclosure. This storage device 1 includes a lower electrode 10 (a first electrode), a storage layer 20 including an ion source layer 21, and an upper electrode 30 (a second electrode) in this order.

For example, as will be described later (FIG. 2), the lower electrode 10 is provided on a substrate 41 that may be made of silicon and in which a CMOS (Complementary Metal Oxide Semiconductor) circuit may be formed, and may serve as a connection section with the CMOS circuit. This lower electrode 10 may be made of a wiring material for use in a semiconductor process, for example, tungsten (W), tungsten nitride (WN), copper (Cu), aluminum (Al), molybdenum (Mo), tantalum (Ta), silicide, or the like. In a case where the lower electrode 10 is made of a material, such as Cu, that may cause ion conduction by an electrical field, a surface of the lower electrode 10 made of Cu or the like may be covered with a material, such as W, WN, titanium nitride (TiN), or tantalum nitride (TaN), that is less likely to cause ion conduction or thermal diffusion.

The storage layer 20 has a configuration in which the ion source layer 21 and a resistance change layer 22 are laminated in order from the upper electrode 30 side. The ion source layer 21 includes an element (a movable element) that forms a conductive path in the resistance change layer 22.

The ion source layer 21 includes the movable element as described above, and is provided in contact with the upper electrode 30 in this case. The movable element is cationized and anionized by application of an electrical field to move into the resistance change layer 22, thereby forming a conductive path. Movable elements that are to be cationized may include transition metal elements, in particular, Group 4 metal elements (titanium (Ti), zirconium (Zr), and hafnium (Hf)), Group 5 metal elements (vanadium (V), niobium (Nb), and tantalum (Ta)), and Group 6 metal elements (chromium (Cr), molybdenum (Mo), and tungsten (W)) in the periodic table. Movable elements that are to be anionized may include Group 16 elements in the periodic table, in particular, chalcogen elements such as tellurium (Te), sulfur (S), and selenium (Se). Since the above-described transition metal elements are relatively chemically stable in a chalcogen matrix, stability of the conductive path in a state in which the conductive path is in contact with the chalcogen element is enhanced. In other words, redissolution of the conductive path into the ion source layer 21 is suppressed. The ion source layer 21 in this embodiment includes one kind or two or more kinds of these cation elements and one kind or two or more kinds of these anion elements.

Moreover, the ion source layer 21 may use oxygen (O) or nitrogen (N). This is because, when the ion source layer 21 includes O or N, a resistance value of the ion source layer 21 is increased, thereby improving controllability of an intermediate resistance value.

In the ion source layer 21, the above-described transition metal element, the above-described chalcogen element, and O (or N) are bonded to one another to form a metal chalcogenide oxide layer. This metal chalcogenide oxide layer (or a metal chalcogenide nitride layer) mainly has an amorphous structure, and serves as an ion supply source. The conductive path including the above-described transition metal element is chemically stabler than other transition metal elements in proximity to the ion source layer 21 and in the resistance change layer 22, and easily causes an intermediate oxidation state and easily retains the state as well.

Moreover, the conductive path formed of the transition metal element and a neighborhood thereof are allowed to have three states "metal state/chalcogen compound state/oxide state" of which resistance values are "low/intermediate/high", respectively. The resistance value of the resistance change layer 22 is determined by a mixture state of these three states, and thus the resistance change layer 22 is allowed to have a stable intermediate resistance value. Further, since chemical stability in a state in which the chalcogen element and the conductive path are in contact with each other is high, retention performance of the intermediate resistance value is improved.

It is to be noted that, as long as effects of the present disclosure are not impaired, the ion source layer 21 may include an element other than the above-described elements, for example, manganese (Mn), cobalt (Co), iron (Fe), nickel (Ni), platinum (Pt), silicon (Si), and the like. As described above, to enable multi-value recording, variation in resistance value (variation in conductance value) among a plurality of devices at each gate voltage may be preferably small, and change in the conductance value by the gate voltage may be preferably gradual. Since the above-described elements do not impair gradual change in the conductance value by the gate voltage, the above-described elements may be desirable as an additive element.

The resistance change layer 22 in this embodiment includes boron (B) and oxygen (O), and is provided in contact with the lower electrode 10 in this case. The resistance value of this resistance change layer 22 changes when a predetermined voltage is applied between the lower electrode 10 and the upper electrode 30. More specifically, when a voltage is applied between the lower electrode 10 and the upper electrode 30, the transition metal element included in the ion source layer 21 moves into the resistance change layer 22 to form the conductive path. In this case, B and O may be included in the form of, for example, boron oxide (BOx) in the resistance change layer 22. A bond between B and O has larger binding energy than most of metal oxides. Therefore, formation of a bond between the transition metal element forming the conductive path and oxygen in the resistance change layer 22 is suppressed. In other words, retention performance of the resistance value of the resistance change layer 22, in particular, a middle resistance value (intermediate resistance value) by writing at a low current is improved. Accordingly, multi-value recording is enabled.

It is to be noted that all of B in the resistance change layer 22 may not be necessarily in the form of oxide, and a part of B may be oxidized.

As a material forming the resistance change layer 22, the following additive elements other than the above-described B and O may be included. Examples of the additive elements may include W, Hf, C, Si, magnesium (Mg), tantalum (Ta), Mg, copper (Cu), nickel (Ni), zirconium (Zr), gadolinium (Gd), and the like. An additive amount of the additive element may be within a range in which improvement in retention performance of the resistance value by B is not impaired. More specifically, the content of B may be preferably 30% or more in a composition ratio of B/a total composition ratio between B and the additive elements. Moreover, in a case where the additive elements as describe above are used, the additive elements may be present in the form of oxide. Even in this case, as long as the content of B is 30% or more in the composition ratio of B/the total composition ratio between B and the additive elements, an effect of improving retention characteristics by large binding energy between B and O is allowed to be obtained.

It is to be noted that, as a constituent material of the resistance change layer 22, N may be included in addition to the above-described elements. N in the resistance change layer 22 functions similarly to O.

Moreover, an initial resistance value of the resistance change layer 22 is allowed to be controlled by adjusting a film thickness thereof as with the ion source layer 21, in addition to by adjusting the degree of oxidation the degree of nitriding. It may be only necessary for the initial resistance value to achieve, for example, device resistance of about several MΩ to about several hundred GΩ, and although the film thickness of the resistance change layer 22 changes its optimum value depending on a device size and the resistance value of the ion source layer 21, the film thickness of the resistance change layer 22 may be preferably, for example, from about 1 nm to about 10 nm both inclusive The upper electrode 30 may use a known semiconductor wiring material as with the lower electrode 10; however, a stable material that does not react with the ion source layer 21 even through post annealing may be preferable.

In the storage device 1 of this embodiment, when a voltage pulse or a current pulse is applied from a power supply circuit (a pulse application means) through the lower electrode 10 and the upper electrode 30, electrical characteristics (the resistance value) of the storage layer 20 changes, and thus writing, erasing, and further reading of information are performed. Such an operation will be described in detail below.

First, a positive voltage is applied to the storage device 1 having an initial state with high resistance, for example, in such a manner that the upper electrode 30 side and the lower electrode 10 side have a positive potential and a negative potential, respectively. Accordingly, the transition metal element in the ion source layer 21 is ionized and moves to the lower electrode 10 side, or oxygen ions move from the lower electrode 10 side to cause a cathode reaction on the lower electrode 10 side, thereby causing reduction reaction at an interface between the lower electrode and the resistance change layer 22. Thus, a portion in which an oxygen defect concentration is increased and a portion in which an oxidation state is low are generated to form a conductive path in the resistance change layer 22. In other words, the resistance change layer 22 has a lower resistance value (a low resistance state) than a resistance value (a high resistance state) in the initial state.

After that, even though the positive voltage is removed to stop application of the voltage to the storage device 1, the low resistance state is retained. Thus, information is written. In a case where a storage unit on which writing is allowed to be performed only once, i.e., a so-called PROM (Programmable Read Only Memory) is used, recording is completed only by the above-described recording process.

On the other hand, when the storage device 1 is applied to an erasable storage unit, i.e., a RAM (Random Access Memory), an EEPROM (Electronically Erasable and Programmable Read Only Memory), or the like, an erasing process is necessary. In the erasing process, a negative voltage is applied to the storage device 1, for example, in such a manner that the upper electrode 30 side and the lower electrode 10 side have a negative potential and a positive potential, respectively. Accordingly, transition metal ions are oxidized by anode reaction in proximity to the conductive path formed in the resistance change layer 22 (more specifically, a portion with a high oxygen defect concentration that forms the conductive path or a conductive path of a portion in which the oxidation state is low) to move to the ion source layer 21 side. Alternatively, oxygen ions move from the ion source layer 21 to the proximity of the conductive path of the resistance change layer 22, and thus in the conductive path, the oxygen defect concentration is decreased, or the oxidation state is increased. Accordingly, the conductive path is disconnected, and the resistance value of the resistance change layer 22 is changed from the low resistance state to the high resistance state.

After that, even though the negative voltage is removed to stop application of the voltage to the storage device 1, a state in which the resistance value is increased is retained. Thus, written information is erased. Writing of information to the storage device 1 and erasing of written information are allowed to be repeatedly performed by repeating such processes.

In the above-described storage device 1, for example, when a state in which the resistance value is high and a state in which the resistance value is low correspond to information "0" and "1", respectively, in a process of recording information by application of the positive voltage, "0" may be changed to "1", and in a process of erasing information by application of the negative voltage, "1" may be changed to "0". It is to be noted that, although an operation of decreasing the resistance of the storage device and an operation of increasing the resistance of the storage device correspond to a writing operation and an erasing operation, respectively, such a correspondence relationship may be defined reversely.

In this embodiment, a bias voltage is controlled when the vias voltage is applied to the lower electrode 10 side in writing, or limiting resistance or a gate voltage of a drive MOS transistor is controlled to adjust a writing current, and thus so-called "writing resistance" is allowed to be controlled, and the intermediate resistance value (a writing conductance value) is allowed to be adjusted. Moreover, in the erasing operation, the intermediate resistance value is allowed to be controlled by adjusting a magnitude of the bias voltage, or a current value by the limiting resistance or the gate voltage of the MOS transistor. Thus, not only a binary memory but also a multi-valued memory is achieved.

For example, intermediate resistance values between the above-described two resistance values "0" and "1" may be adjusted to add, for example, two levels, and the respective levels may be defined as "00", "01", "10", and "11", thereby allowing four values to be recorded. In other words, 2-bit information is allowed to be recorded per device.

A method of manufacturing the storage device 1 of this embodiment will be described below.

First, the lower electrode 10 that may be made of, for example, TiN is formed on a substrate in which a CMOS circuit such as a selection transistor is formed. After that, if necessary, reverse sputtering or the like may be performed to remove an oxide and the like on a surface of the lower electrode 10. Then, after a film of boron (B) is formed with a film thickness of 2 nm on the lower electrode 10, oxidation is performed on the film by oxygen plasma to form a boron oxide (BOx) film serving as the resistance change layer 22. Next, the ion source layer 21 and the upper electrode 30 are sequentially formed in a sputtering apparatus with use of targets having compositions suitable for materials of the respective layers while replacing the targets. An electrode diameter is 50 to 300 nm$\phi$ both inclusive. An alloy film is formed together with use of the targets of the respective constituent elements.

After films up to the upper electrode 30 are formed, a wiring layer (not illustrated) that is to be connected to the upper electrode 30 is formed, and is connected to a contact section configured to obtain a common potential for all storage devices 1. After that, a post annealing process is performed on the laminated films. Thus, the storage device 1 illustrated in FIG. 1 is completed.

In the storage device 1, as described above, the conductive path is formed in the resistance change layer 22 by applying a voltage in such a manner that the upper electrode 30 and the lower electrode 10 have a positive potential and a negative potential, respectively. Accordingly, the resistance value of the resistance change layer 22 is decreased, and writing is performed. Next, the metal element of the conductive path formed in the resistance change layer 22 is ionized and moves into the ion source layer 21 by applying a voltage of a polarity opposite to that in writing to the upper electrode 30 and the lower electrode 10. Alternatively, oxygen ions move from the ion source layer 21 to, in particular, a conductive path portion of the resistance change layer 22. Accordingly, the oxygen defect concentration is decreased, or the oxidation state is increased, and thus the conductive path is disconnected. Therefore, the resistance value of the resistance change layer 22 is increased, and erasing is performed. Moreover, the intermediate resistance value is controlled by adjusting a voltage that is to be applied in writing and erasing, thereby enabling multi-value recording.

In a typical miniaturized storage device, a drive current of a transistor is decreased to decrease a drive current for writing; therefore, a resistance value in the low resistance state is further increased to narrow an interval (a resistance interval) between the resistance values in the low resistance state and the high resistance state. Therefore, the more the storage device is miniaturized, the more difficult it is to control resistance in multi-value recording.

More specifically, for a multi-value operation, it is necessary to control, in the narrow resistance interval, intermediate resistance values obtained by separating the narrow resistance interval into, for example, four levels (2 bits/cell) or eight levels (3 bits/cell). Therefore, to achieve the multi-value recording, it is important to secure a sufficient margin between a maximum drive current and a writing-retainable minimum current value. For example, in a case where the maximum drive current of the storage device with a retainable minimum current value of 50 µA is 50 µA, multi-value recording is substantially impossible.

The maximum drive current of the storage device is determined depending on use of a process of how small the storage device is miniaturized, or what kind of storage device is used. As described above, typically, there is a tendency that the more the storage device is miniaturized, the more the drive current is decreased. On the other hand, the minimum drive current depends on the storage layer.

In the storage device 1 of this embodiment, as materials of the resistance change layer 22 configuring the storage layer 20, oxygen (O) and boron (B) are used. Binding energy between O and B is larger than that of an oxide of the metal element forming the conductive path; therefore, natural oxidation of the conductive path is suppressed.

As described above, in this embodiment, as the material of the resistance change layer 22, B with large binding energy to O is used; therefore, natural oxidation of the conductive path is suppressed, and data retention performance of the storage device 1 is improved. Accordingly, controllability of the intermediate resistance value between the low resistance state and the high resistance state is allowed to be improved, and a storage unit in which multi-value recording is enabled is allowed to be provided.

(1-2. Storage Unit)

A storage unit (memory) may be configured of a large number of the above-described storage devices 1 arranged in, for example, a line or a matrix. At this time, if necessary, each of the storage devices 1 may be connected to a MOS transistor for device selection or a diode to configure a memory cell, and further may be connected to a sense amplifier, an address recorder, a writing-erasing-reading circuit, and the like through wires.

FIGS. 2 and 3 illustrate an example of the storage unit (memory cell array) in which a large number of storage devices 1 are arranged in a matrix, where FIG. 2 and FIG. 3 illustrate a sectional configuration and a planar configuration, respectively. In this memory cell array, a wire connected to the lower electrode 10 side and a wire connected to the upper electrode 30 side are provided for each of the storage devices 1 to intersect with each other, and the respective storage devices 1 may be arranged around respective intersections of these wires, for example.

The respective storage devices 1 share the resistance change layer 22, the ion source layer 21, and the upper electrode 30. In other words, each of the resistance change layer 22, the ion source layer 21, and the upper electrode 30 is configured of a common layer (a same layer) for the respective storage devices 1. The upper electrode 30 serves as a common plate electrode PL for adjacent cells.

On the other hand, since the lower electrode 10 is separately provided for each of the memory cells, adjacent ones of the lower electrodes 10 are electrically isolated from each other, and the storage devices 1 of the respective memory cells are defined in positions corresponding to the respective lower electrodes 10. The respective lower electrodes 10 are connected to respective corresponding MOS transistors Tr for cell selection, and the respective storage devices 1 are provided above these respective MOS transistors Tr.

Each of the MOS transistors Tr includes source/drain regions 43 and a gate electrode 44 that are formed in a region separated by a device separation layer 42 in the substrate 41. A side-wall insulating layer is formed on a wall surface of the gate electrode 44. The gate electrode 44 also serves as a word line WL that is one of address wires of each storage device 1. One of the source/drain regions 43 in the MOS transistor Tr is electrically connected to the lower electrode 10 of each storage device 1 through a plug layer 45, a metal wiring layer 46, and a plug layer 47. The other of the source/drain regions 43 in the MOS transistor Tr is connected to the metal wiring layer 46 through the plug layer 45. The metal wiring layer 46 is connected to a bit line BL (refer to FIG. 3) that is the other of the address wires of the storage device 1. It is to be noted that, in FIG. 3, an active region 48 of the MOS transistor Tr is indicated by a dashed line, and a contact section 51 is connected to the lower electrode 10 of the storage devices 1, and a contact section 52 is connected to the bit line BL.

In this memory array, when a gate of the MOS transistor Tr is turned to an ON state by the word line WL to apply a voltage to the bit line BL, the voltage is applied to the lower electrode 10 of a selected memory cell through the source/drain of the MOS transistor Tr. Here, when a polarity of the voltage applied to the lower electrode 10 is a negative potential relative to a potential of the upper electrode 30 (the plate electrode PL), the resistance value of the storage device 1 is changed to the low resistance state, as described above. Thus, information is written to the selected memory cell. Next, when a voltage of a positive potential relative to the potential of the upper electrode 30 (the plate electrode PL) is applied to the lower electrode 10, the resistance value of the storage device 1 is changed to the high resistance state again. Accordingly, the information written to the selected memory cell is erased. When the written information is read, for example, a memory cell may be selected by the MOS transistor Tr, and a predetermined voltage or current is applied to the selected memory cell. The current or voltage that is different depending on the resistance state of the storage device 1 at this time is detected through the sense amplifier or the like connected to an end of the bit line BL or the plate electrode PL. It is to be noted the voltage or current applied to the selected memory cell is lower than a threshold value of the voltage or the like at which the state of the resistance value of the storage device 1 changes.

As described above, the storage unit 2 of this embodiment is applicable to various types of memory units. For example, the storage unit 2 is applicable to any memory types such as PROMs on which writing is allowed to be performed only once, EEPROMs on which electrical erasing is allowed to be performed, and so-called RAMs on which high-speed writing, erasing, and reproducing are allowed to be performed.

A modification example (Modification Example 1) of the above-described first embodiment, and a second embodiment and a modification example (Modification Example 2)

thereof will be described below. It is to be noted that like components are denoted by like numerals as of the above-described first embodiment and will not be further described.

(2. Modification Example 1)

FIG. 4 illustrates a sectional configuration of a storage device 3 according to the modification example of the above-described first embodiment. The storage device 3 in this modification example is different from the first embodiment in that a resistance change layer 62 configuring a storage layer 60 has a laminate configuration.

The storage layer 60 has a configuration in which an ion source layer 61 and the resistance change layer 62 are laminated in order from the upper electrode 30 side as with the first embodiment. In this case, the ion source layer 61 includes an element (a movable element) that forms a conductive path in the resistance change layer 62, and a constituent material of the ion source layer 61 is similar to that of the above-described ion source layer 21.

As described above, the resistance change layer 62 has a laminate configuration, and is configured of a first resistance change layer 62A including boron (B) and a second resistance change layer 62B including another element or an oxide or a nitride thereof. The laminate order of the first resistance change layer 62A and the second resistance change layer 62B is not specifically limited, and, as illustrated in FIG. 4, the first resistance change layer 62A including B may be provided closer to the lower electrode 10 or closer to the upper electrode 30 (closer to the ion source layer 61).

The element configuring the first resistance change layer 62A may preferably include oxygen (O) in addition to the above-described B. It is to be noted that, in a case where the second resistance change layer 62B includes O, O may not be necessarily included in the first resistance change layer 62A. However, when O is used in a layer including B, writing retention performance at a low current is improved.

As the element configuring the second resistance change layer 62B, the additive elements described in the above-described embodiment may be used. More specifically, Hf, C, Si, Mg, Ta, C, Mg, Cu, Ni, Zr, Gd, and the like may be used, and the second resistance change layer 62B includes these additive elements in the form of simple substance, oxide, or nitride.

As described above, even if the resistance change layer 62 has the laminate configuration of the first resistance change layer 62A including B and O and the second resistance change layer 62B including the additive elements, effects similar to those in the above-described embodiment are obtained. It is to be noted that the resistance change layer 62 in this case has a two-layer configuration; however, the resistance change layer 62 is not limited thereto, and may have a multilayer configuration of three or more layers. It may be only necessary to include at least B, O, and the above-described additive elements in any of layers configuring the resistance change layer 62.

(3. Second Embodiment)

FIG. 5 illustrates a sectional configuration of a storage device 4 according to the second embodiment of the present disclosure. This storage device 4 includes the lower electrode 10, a storage layer 70 including an ion source layer, and the upper electrode 30 in this order, as with the above-described first embodiment. This embodiment is different from the first embodiment in that an ion source layer 71 and a resistance change layer 72 configuring the storage layer 70 are formed of a chalcogen compound and an oxide of a same kind of metal element, respectively.

The ion source layer 71 includes one kind or two kinds of movable elements capable of being anionized and one kind or two or more kinds of movable elements capable of being cationized, and is provided in contact with the upper electrode 30 in this case. The movable elements include, as the movable elements that are to be cationized, transition metal elements described in the above-described first embodiment, specifically, Group 4 metal elements (Ti, Zr, and Hf), Group 5 metal elements (V, Nb, and Ta), and Group 6 metal elements (Cr, Mo, and W) in the periodic table. As the movable elements that are to be anionized, the elements described in the first embodiment may be used, as with the movable elements capable of being cationized. Specifically, Group 16 elements in the periodic table, more specifically, chalcogen elements such as Te, S, and Se are used.

Moreover, as with the first embodiment, oxygen (O) or nitrogen (N) may be used for the ion source layer 71. The resistance value of the ion source layer 71 is increased by including O or N, thereby improving controllability of the intermediate resistance value. Further, the ion source layer 71 may include elements other than the above-described elements, for example, Mn, Co, Fe, nickel (Ni), platinum Pt, Si, and the like as long as effects of the present disclosure are not impaired.

The resistance change layer 72 includes a metal element of the same kind as that of the metal elements (the transition metal elements included in the Groups 4 to 6 of the periodic table) included in the ion source layer 71, and O, and is provided in contact with the lower electrode 10 in this case. As described above, when a predetermined voltage is applied between the lower electrode 10 and the upper electrode 30, a resistance value of the resistance change layer 72 changes. Therefore, even if transition metal ions move by a voltage bias between the resistance change layer 72 and the ion source layer 71, defect movement or a change in the oxidation state becomes equivalent by forming the ion source layer 71 and the resistance change layer 72 with use of the transition metal elements of the same kind. In other words, as long as transition metals of the same kind are used, there is no difference in equilibrium potential between different metals; therefore, it is advantageous to retention characteristics. Moreover, the transition metal elements included in the Groups 4 to 6 of the periodic table have a large valence such as valences of +4 to +6. Therefore, a smaller valence than that of a stoichiometric composition is also easily stabilized, and a generated defect is easily stabilized. Thus, random telegraph noise (RTN) is reduced by forming an interface between an oxide and a chalcogen compound of Group 4 to 6 transition metal elements in the periodic table.

As a material forming the resistance change layer 72, an additive element other than the above-described transition metal elements included in the Group 4 to 6 of the periodic table and O may be included as long as effects of the present disclosure are not impaired. Examples of the additive element may include W, Hf, C, Si, Mg, Ta, Mg, Ni, Zr, Gd, and the like. Moreover, N may be included in addition to the above-described element. N in the resistance change layer 22 functions similarly to O. It is to be noted that the additive element for the resistance change layer 72 may be preferably an element that does not largely change (decrease) the resistance of the ion source layer. Therefore, it may be desirable to avoid Cu, Al, and the like with high mobility by voltage application.

As with the first embodiment, it may be only necessary for the initial resistance value to achieve, for example, device resistance of about several MΩ to about several hundred GΩa, and although film thickness of the resistance change layer 72 changes its optimum value depending on a device size and the resistance value of the ion source layer 71, the film thickness of the resistance change layer 72 may be preferably, for example, from about 1 nm to about 10 nm both inclusive.

As described above, in a typical storage device, for example, when the lower electrode side in the initial state at high resistance is biased toward negative (−), the resistance change layer generates an oxygen defect by voltage application and a conductive path is formed to decrease the resistance of the resistance change layer. Moreover, the intermediate resistance value (a writing conductance value) is allowed to be adjusted by controlling a bias voltage when the bias voltage is applied to the lower electrode 10 side in writing or by controlling limiting resistance or a gate voltage of a drive MOS transistor. Thus, not only a binary memory but also a multi-valued memory is achieved.

However, in a case where the ion source layer is formed of only the metal element, when an oxygen defect is introduced into the resistance change layer to perform writing, the oxygen defect formed in the resistance change layer is repeatedly generated and disappears. This is because charge deviation around the oxygen defect is difficult to stably exist due to a low relative dielectric constant of the ion source layer located in contact with the resistance change layer; therefore, resistance variation, i.e., random telegraph noise is caused every time writing data is read.

On the other hand, in this embodiment, the chalcogen element with a high relative dielectric constant is used for the ion source layer 71 located in contact with the resistance change layer 72. Moreover, the metal elements of the same kind, more specifically, the Group 4 to 6 transition metal elements in the periodic table are used for the ion source layer 71 and the resistance change layer 72. Therefore, charge deviation around the oxygen defect formed in writing is allowed to be stabilized.

As described above, in the storage device 4 of this embodiment, the chalcogen element with a high relative dielectric constant is used for the ion source layer 71, and the Group 4 to 6 transition metal elements in the periodic table are used for the ion source layer 71 and the resistance change layer 72. Therefore, charge deviation around the oxygen defect formed in writing is allowed to be stabilized, thereby reducing random telegraph noise. Thus, a storage unit in which multi-value recording is enabled is allowed to be provided.

(4. Modification Example 2)

FIG. 6 illustrates a sectional configuration of a storage device 5 according to the modification example of the above-described second embodiment. The storage device 5 in this modification example is different from the second embodiment in that a resistance change layer 82 configuring a storage layer 80 has a laminate configuration as with the above-described Modification Example 1.

The storage layer 80 has a configuration in which an ion source layer 81 and the resistance change layer 82 are laminated in order from the upper electrode 30 side as with the second embodiment. In this case, the ion source layer 81 includes a movable element that forms a conductive path in the resistance change layer 82, and a constituent material of the ion source layer 81 is similar to that of the above-described ion source layer 71.

As described above, the resistance change layer 82 has a laminate configuration, and is configured of a first resistance change layer 82A including the Group 4 to 6 transition metal elements in the periodic table and O, and a second resistance change layer 82B including an oxide, a nitride, or an oxynitride of another element. As illustrated in FIG. 6, the laminate order of the first resistance change layer 82A and the second resistance change layer 82B may be preferably so set as to locate the first resistance change layer 82A including the Group 4 to 6 transition metal elements in the periodic table in contact with the ion source layer 81. Accordingly, stability of the oxygen defect formed in the first resistance change layer 82A in writing is improved.

Elements configuring the first resistance change layer 82A may preferably include oxygen (O) in addition to the above-described Group 4 to 6 transition metal elements in the periodic table. It is to be noted that, in a case where the second resistance change layer 82B includes O, the first resistance change layer 82A may not necessarily include O. In a case where O is included in the second resistance change layer 82B, the Group 4 to 6 transition metal elements in the periodic table included in the first resistance change layer 82A are oxidized to form a transition metal oxide in the first resistance change layer 82A.

The element configuring the second resistance change layer 82B may be preferably an element with a high resistance value even in a metal state, examples of the element may include boron (B) and silicon (Si), and B and Si may be preferably used, for example, in the form of boron oxide, silicon oxide, boron carbide oxide, or the like. Moreover, as with the second embodiment, Cu, Al, and the like with high mobility by voltage application may be desirably avoided.

As described above, even if the resistance change layer 82 has the laminate configuration of the first resistance change layer 82A including the Group 4 to 6 transition metal elements in the periodic table and O, and the second resistance change layer including an oxide of another element, effect similar to those in the above-described second embodiment are obtained. It is to be noted that the resistance change layer 82 in this case has a two-layer configuration; however, the resistance change layer 82 is not limited thereto, and may have a multilayer configuration of three or more layers. It may be only necessary to locate a layer including the Group 4 to 6 transition metal elements in the periodic table and O in contact with the ion source layer 81 including the chalcogen element and the Group 4 to 6 transition metal elements in the periodic table.

(5. Example)

Specific examples of the present disclosure will be described below. It is to be noted that Experiments 1 to 7 are examples relative to the first embodiment and Modification Example 1, and Experiment 8 is an example relative to the second embodiment and Modification Example 2.

(Experiment 1)

Respective Samples (Experimental Examples 1-1 to 1-4) were fabricated with use of the above-described method of manufacturing the storage device 1. First, after the lower electrode 10, made of TiN, in which a transistor was embedded in a base was cleaned by reverse sputtering, a film of B was formed with a thickness of 2 nm (or 3 nm), and the film of B was oxidized by oxygen plasma to form BOx, thereby forming a film of Box as the resistance change layer 22. Next, for the ion source layer 21, reactive sputtering was performed using 50% of Hf and 50% of Te in an atomic % ratio in an argon (Ar) process gas mixed with oxygen at a flow ratio of, for example, argon (sccm)/oxygen (sccm)=75/5. Accordingly, an HfTe—Ox film was formed with a film thickness of 45 nm Next, W with a thickness of 30 nm was formed to form the upper electrode 30. Finally, heat treatment was performed for 2 hours at 320° C., and then patterning was performed to fabricate the storage device 1

(Experimental Examples 1-1 to 1-4). The compositions of the respective samples are described below in order of "lower electrode/resistance change layer/ion source layer/upper electrode". It is to be noted that, as film thicknesses of the respective layers in respective samples, the film thickness of the ion source layer 21 was 45 nm, and the film thickness of the upper electrode 30 was 30 nm.

(Experimental Example 1-1) TiN/B(2 nm)-Ox/Hf50Te50-Ox/W;Oxidation Time 120 sec.
(Experimental Example 1-2) TiN/B(3 nm)-Ox/Hf50Te50-Ox/W;Oxidation Time 30 sec.
(Experimental Example 1-3)TiN/Al(2 nm)-Ox/Hf50Te50-Ox/W
(Experimental Example 1-4)TiN/Hf(2 nm)-Ox/Hf50Te50-Ox/W Respective memory arrays (each having 60 bits) configured of the above-described samples (Experimental Examples 1-1 to 1-4) were fabricated, and a writing operation was performed. More specifically, under a writing voltage of 3.8 V and a writing pulse width of 10 μm, a gate voltage of a MOS transistor was adjusted to change a writing current in a range of 3 to 35 μA, and conductance values at respective writing current values were read. Next, a temperature accelerated retention test (at 150° C. for 1 hour) was performed on each of the samples to measure change in conductance value in each of the samples before and after the temperature accelerated retention test (hereinafter simply referred to as "retention test").

FIG. 7 illustrates a distribution of the conductance values of Experimental Example 1-1 before and after the retention test at a writing current of 9 μA. A region enclosed by a dotted line in the drawing indicates variation in conductance value before and after the retention test, i.e., variation in resistance value within ±25%. In this case, variation in resistance value within ±25% is considered as a successful retention example. FIG. 8 is a plot of a retention success rate of the resistance value at respective writing current values in Experimental Example 1-1. In this case, under a condition that a current value at which the retention success rate was 60% or more was a retainable minimum writing current value (hereinafter simply referred to as "minimum current value"), the minimum current value of Experimental Example 1-1 was 9 μA. Moreover, although not illustrated here, the minimum current values of Experimental Examples 1-2 to 1-4 were determined with use of similar criteria. Table 1 illustrates

TABLE 1

| | Minimum Current Value (μmA) | Configuration of Resistance Change Layer |
|---|---|---|
| Experimental Example 1-1 | 9 | BOx |
| Experimental Example 1-2 | 9 | BOx |
| Experimental Example 1-3 | 15 | AlOx |
| Experimental Example 1-4 | 15 | HfOx |

It was found from Table 1 that Experimental Examples 1-1 and 1-2 in which the resistance change layer 22 included B were allowed to retain the resistance value even in a case where writing was performed at a lower current, compared to AlOx and HFOx typically used as the material of the resistance change layer 22. The reason for this was not exactly clear, but it was considered that the reason was a difference in bond strength (binding energy) to O. Table 2 illustrates tabulated binding energy of B, Hf, Zr, and Al to O.

TABLE 2

| Bonding | Bond Strength |
|---|---|
| B—O | 8.38 |
| Hf—O | 8.30 |
| Zr—O | 8.03 |
| Al—O | 5.30 |

As illustrated in Table 2, an oxide of B had higher binding energy to O than metal oxides of Al and the like. The conductive path formed by electromigration of the metal element included in the ion source layer 21 into the resistance change layer 22 by application of the writing voltage takes O from a neighborhood thereof to be oxidized, thereby causing variation in resistance value after the retention test, for example, an increase in resistance. It is considered that, in Experimental Examples 1-1 and 1-2, formation of a bond between the metal element (Hf in this case) forming the conductive path and O was suppressed by using B with high binding energy to O for the resistance change layer 22, thereby retaining the resistance value.

However, in Experimental Example 1-4 in which HfOx was used for the resistance change layer 22, the minimum current value was not improved. It is considered that this is because the same Hf as the constituent element (herein, Hf) of the conductive path formed by application of the writing voltage was used as the constituent material of the resistance change layer 22; therefore, even though Hf with a bond strength to O substantially equal to that of B was used, the retainable minimum current value was not improved. Therefore, it is considered that retention performance of the resistance value by writing at a low current was improved by using, as the material of the resistance change layer 22, an element with a large bond strength (binding energy) to O such as forming a covalent bond of an element other than metal elements such a boron oxide (Box).

Moreover, Experimental Example 1-2 exhibited the same minimum current value as that of Experimental Example 1-1. In Experimental Example 1-2, plasma oxidation time on a film of B formed on the lower electrode 10 was ¼ (30 sec.) of that in Experimental Example 1-1. Compared to Experimental Example 1-1 in which B in the resistance change layer 22 was almost completely oxidized, in the oxidation state of B in the resistance change layer 22 in Experimental Example 1-2, a ratio of boron oxide was increased from the lower electrode 10 to the ion source layer 21 along a film thickness direction. Since Experimental Example 1-1 and Experimental Example 1-2 between which the oxidation state of B in the resistance change layer 22 was different had the same minimum current value, it is found that B included in the resistance change layer 22 is not necessarily oxidized completely, and, for example, even in a state in which B and boron oxide such as $B_2O_3$ are mixed, similar effects are obtained. Incidentally, although not illustrated here, while the retention success rate of Experimental Example 1-1 in which the writing current value was 9 μA was 60%, the retention success rates of Experimental Examples 1-3 and 1-4 in which B was not included in the resistance change layer was about 10%.

(Experiment 2)

Next, samples (Experimental Examples 2-1 to 2-6) were fabricated in similar processes to those in Experiment 1, except that the film configuration of the resistance change layer 22 was changed as follows, and the minimum current value of each of the samples was determined Table 3 illustrates tabulated results of Experimental Examples 2-1 to 2-6. It is to be noted that, as film thicknesses of the respective layers in respective samples, the film thickness of the resistance change layer 22 was 2 to 3 nm, the film thickness of the ion source layer was 45 nm, and the film thickness of the upper electrode 30 was 30 nm.

(Experimental Example 2-1) TiN/Hf—B—Ox/Hf50Te50-Ox/W
(Experimental Example 2-2) TiN/Hf—Si—Ox/Hf50Te50-Ox/W
(Experimental Example 2-3) TiN/Hf—Al—Ox/Hf50Te50-Ox/W
(Experimental Example 2-4) TiN/Hf—C—Ox/Hf50Te50-Ox/W
(Experimental Example 2-5) TiN/Al—B—Ox/Hf50Te50-Ox/W
(Experimental Example 2-6) TiN/Al—C—Ox/Hf50Te50-Ox/W

TABLE 3

| | Minimum Current Value (μmA) | Configuration of Resistance Change Layer |
|---|---|---|
| Experimental Example 2-1 | 11 | Hf—B—Ox |
| Experimental Example 2-2 | 11 | Hf—Si—Ox |
| Experimental Example 2-3 | 13 | Hf—Al—Ox |
| Experimental Example 2-4 | 15 | Hf—C—Ox |
| Experimental Example 2-5 | 11 | Al—B—Ox |
| Experimental Example 2-6 | 13 | Al—C—Ox |

Experimental Examples 2-1 and 2-5 in which B was included in the resistance change layer 22 were allowed to retain the writing state at a lower current than in the above-described Experimental Examples 1-3 and 1-4 in which AlOx or HfOx was singly used as the material of the resistance change layer 22. In other words, it is found that, even if AlOx or HfOx is included in the resistance change layer 22, the retention performance of the intermediate resistance value is improved by including B. As illustrated in Table 2, it is considered that this was because a bond between B and O was tighter, compared to the metal elements such as Hf and Al, and thus reoxidation of the conductive path formed in the resistance change layer 22 was suppressed. Alternatively, it is considered that this was because a phenomenon of bonding to an oxygen ion obtained by breaking the bond between B and O was less likely to occur even in a case where an oxygen defect was introduced into the resistance change layer 22.

(Experiment 3)

Next, samples (Experimental Examples 3-1 to 3-5) were fabricated in similar processes to those in Experiment 1, except that the ratio of B included in the resistance change layer 22 was changed, and the minimum current value of each of the samples was determined Table 4 illustrates tabulated results of Experimental Examples 3-1 to 3-5. It is to be noted that, as film thicknesses of the respective layers in respective samples, the film thickness of the resistance change layer 22 was 2 nm, the film thickness of the ion source layer was 45 nm, and the film thickness of the upper electrode 30 was 30 nm.

(Experimental Example 3-1) TiN/Hf80-B20-Ox/Hf50Te50-Ox/W
(Experimental Example 3-2) TiN/Hf70-B30-Ox/Hf50Te50-Ox/Wm
(Experimental Example 3-3) TiN/Hf50-B50-Ox/Hf50Te50-Ox/Wm
(Experimental Example 3-4) TiN/Hf30-B70-Ox/Hf50Te50-Ox/Wm
(Experimental Example 3-5) TiN/Hf10-B90-Ox/Hf50Te50-Ox/Wm

TABLE 4

| | Minimum Current Value (μmA) | Configuration of Resistance Change Layer |
|---|---|---|
| Experimental Example 3-1 | 15 | Hf80—B20—Ox |
| Experimental Example 3-2 | 13 | Hf70—B30—Ox |
| Experimental Example 3-3 | 11 | Hf50—B50—Ox |
| Experimental Example 3-4 | 11 | Hf30—B70—Ox |
| Experimental Example 3-5 | 9 | Hf10—B90—Ox |

It was found from Table 4 that, in Experimental Examples 3-2 to 3-5, the minimum current value was improved more than in a case where HfOx was singly used as the material of the resistance change layer 22 such as Experimental Example 1-3. In other words, it is found that, as long as the composition ratio of B in the resistance change layer 22 is 30% or more with respect to the total of B and the additive element included in the resistance change layer 22, retention of the writing state at a low current, i.e., retention performance of the intermediate resistance value is allowed to be improved. Moreover, it is found that, when the composition ratio of B is 50% or more, the minimum current value is allowed to be more improved, and retention performance is improved.

(Experiment 4)

Next, samples (Experimental Examples 4-1 to 4-5) were fabricated in similar processes to those in Experiment 1, except that an additive element other than Hf was used for the resistance change layer 22, and the minimum current value of each of the samples was determined Table 5 illustrates tabulated results of Experimental Examples 4-1 to 4-5. It is to be noted that the composition ratio of the additive element in this experiment was 10% in fractions of B and the additive element (the fraction of B was 90%). Moreover, as film thicknesses of the respective layers in respective samples, the film thickness of the resistance change layer 22 was 2 nm, the film thickness of the ion source layer was 45 nm, and the film thickness of the upper electrode 30 was 30 nm.

(Experimental Example 4-1) TiN/Zr—B—Ox/Hf50Te50-Ox/W
(Experimental Example 4-2) TiN/Gd—B—Ox/Hf50Te50-Ox/W
(Experimental Example 4-3) TiN/Si—B—Ox/Hf50Te50-Ox/W
(Experimental Example 4-4) TiN/Mg—B—Ox/Hf50Te50-Ox/W
(Experimental Example 4-5) TiN/C—B—Ox/Hf50Te50-Ox/W

TABLE 5

| | Minimum Current Value (μmA) | Configuration of Resistance Change Layer |
|---|---|---|
| Experimental Example 4-1 | 13 | Zr—B—Ox |
| Experimental Example 4-2 | 13 | Gd—B—Ox |
| Experimental Example 4-3 | 9 | Si—B—Ox |
| Experimental Example 4-4 | 11 | Mg—B—Ox |
| Experimental Example 4-5 | 11 | C—B—Ox |

It is found from Table 5 that, in Experimental Examples 4-1 to 4-5, the minimum current value was improved more than in Experimental Examples 1-3 and 1-4. It is considered that this was because a tight B—O bond was formed by including a sufficient amount of B (the fraction of B was 90%) in the resistance change layer 22, and oxidation of the conductive path formed in the resistance change layer 22 was suppressed. Alternatively, it is considered that this was because a phenomenon of bonding the metal element forming the conductive path and an oxygen ion was less likely to occur by the B—O bond even in a case where an oxygen defect was introduced into the resistance change layer 22. Therefore, it is considered that, even in a case where solid writing by a high current value is not performed, retention performance of the resistance value is improved.

(Experiment 5)

Next, samples (Experimental Examples 5-1 and 5-2) were fabricated in similar processes to those in Experiment 1, except that the resistance change layer had a laminate configuration (the resistance change layer 62), and the minimum current value of each of the samples was determined. In this case, the resistance change layer 62 of Experimental example 5-1 was formed by first forming a film of B on the lower electrode 10 and then oxidizing the film of B (the first resistance change layer 62A), and subsequently forming a film of Hf and then oxidizing the film of Hf (the second resistance change layer 62B). The resistance change layer 62 of Experimental Example 5-2 was formed by forming a film of Hf on the lower electrode 10 and then oxidizing the film of Hf (the second resistance change layer 62B), and subsequently forming a film of B (the first resistance change layer 62A). Table 6 illustrates tabulated results of Experimental Examples 5-1 and 5-2. It is to be noted that, as film thicknesses of the respective layers in respective samples, the film thickness of the resistance change layer 22 was 2 nm, the film thickness of the ion source layer was 45 nm, and the film thickness of the upper electrode 30 was 30 nm.

(Experimental Example 5-1) TiN/B—Ox/Hf—O/Hf50Te50-Ox/W (Experimental Example 5-2)TiN/Hf—Ox/B/Hf50Te50-Ox/W

TABLE 6

| | Minimum Current Value (μmA) | Configuration of Resistance Change Layer |
|---|---|---|
| Experimental Example 5-1 | 11 | B—Ox/Hf—O |
| Experimental Example 5-2 | 13 | Hf—Ox/B |

It is found from Table 6 that, compared to Experimental Examples 1-3 and 1-4 as relative techniques, in each of Experimental Examples 5-1 and 5-2, the minimum current value was improved, and retention performance of the intermediate resistance value was improved. However, in Experimental Example 5-1, the retention performance was improved more than in Experimental Example 5-2. It is considered that this is because of whether or not the oxidation process was performed after the film of B was formed. Therefore, it is considered that the retention performance of the storage devices 1 and 2 is improved by including B in the resistance change layers 22 and 62; however, retention performance at a low current is more improved by actively oxidizing B to form a B—O bond in the resistance change layers 22 and 62. It is to be noted that, it may be easily guessed from results of Experiment 4 that the material of the second resistance change layer 62B is not limited to Hf, and even if an additive element such as Si, C, or Mg other than Hf is used, similar effect are obtained.

(Experiment 6)

Next, a sample (Experimental Example 6) was fabricated in similar processes to those in Experiment 1, except that the resistance change layer 22 was formed of BNx, and the minimum current value of the sample was determined. In this case, the resistance change layer 22 was formed by performing reactive sputtering in an argon (Ar) process gas mixed with nitrogen (N) at a flow ratio of, for example, argon (sccm)/oxygen (sccm)=75/5 to form a film of B on the lower electrode 10. Table 7 illustrates tabulated results of Experimental Example 6 and Experimental Examples 1-1, 1-3, and 1-4 as references. It is to be noted that, as film thicknesses of the respective layers in Experimental Example 6, the film thickness of the resistance change layer 22 was 4 nm, the film thickness of the ion source layer was 45 nm, and the film thickness of the upper electrode was 30 nm.

(Experimental Example 6) TiN/BNx/Hf50Te50-Ox/W

TABLE 7

| | Minimum Current Value (μmA) | Configuration of Resistance Change Layer |
|---|---|---|
| Experimental Example 6 | 15 | BNx |
| Experimental Example 1-1 | 9 | BOx |
| Experimental Example 1-3 | 15 | AlOx |
| Experimental Example 1-4 | 15 | HfOx |

As can be seen from Table 7, in Experimental Example 6, an improvement in the retainable minimum current value was not observed. It is because a B—N bond is weaker than a B—O bond; therefore, the conductive path by a filament formed of the metal element included in the ion source layer 21 in the resistance change layer 22 is electrically oxidized (nitrided to be precise), thereby increasing the resistance of the resistance change layer 22. In other words, the retention performance of Experimental Example 6 is equivalent to relative techniques in which AlOx or HfOx is used for the resistance change layer 22 such as Experimental Examples 1-3 and 1-4. Therefore, it is found that B included in the resistance change layer 22 may be preferably bonded to O. It is to be noted that, although not illustrated here, as can be easily seen from the results of Al—B—Ox in Experimental Examples 2-5 and the like, even though N is included in the resistance change layer, retention performance is improved as long as O is also included in the resistance change layer.

(Experiment 7)

Next, samples (Experimental Examples 7-1 to 7-5) were fabricated in similar processes to those in Experiment 1, except that the film configuration of the ion source layer 21 was changed as follows, and the minimum current value of each of the samples was determined. Moreover, samples (Experimental Examples 7-6 to 7-10) were fabricated by changing the film configuration of the ion source layer 21 in a similar manner to that in Experimental Examples 7-1 to 7-5 and using, instead of B, Al as the material of the resistance change layer 22, and the minimum current value of each of the samples was determined Table 8 illustrates tabulated results of Experimental Examples 7-1 to 7-10. It is to be noted that, as film thicknesses of the respective layers in the respective samples, the film thickness of the resistance change layer 22 was 2 nm, the film thickness of the ion source layer was 45 nm, and the film thickness of the upper electrode was 30 nm.

(Experimental Example 7-1) TiN/B—Ox/Zr—Te—Ox/W
(Experimental Example 7-2) TiN/B—Ox/W—Hf—Te—Ox/W
(Experimental Example 7-3) TiN/B—Ox/Ta—Hf—Te—Ox/W
(Experimental Example 7-4) TiN/B—Ox/Hf—Te—Ox—Nx/W
(Experimental Example 7-5) TiN/B—Ox/Zr—Al—Cu—Te/W
(Experimental Example 7-6) TiN/Al—Ox/Zr—Te—Ox/W
(Experimental Example 7-7) TiN/Al—Ox/W—Hf—Te—Ox/W
(Experimental Example 7-8) TiN/Al—Ox/Ta—Hf—Te—Ox/W
(Experimental Example 7-9) TiN/Al—Ox/Hf—Te—Ox—Nx/W
(Experimental Example 7-10) TiN/Al—Ox/Zr—Al—Cu—Te/W

TABLE 8

| | Minimum Current Value (μmA) | Configuration of Ion Source Layer | Configuration of Resistance Change Layer |
|---|---|---|---|
| Experimental Example 7-1 | 15 | Zr—Te—Ox | B—Ox |
| Experimental Example 7-2 | 11 | W—Hf—Te—Ox | B—Ox |
| Experimental Example 7-3 | 9 | Ta—Hf—Te—Ox | B—Ox |
| Experimental Example 7-4 | 11 | Hh—Te—Ox—Nx | B—Ox |
| Experimental Example 7-5 | 13 | Zr—Al—Cu—Te | B—Ox |
| Experimental Example 7-6 | 17 | Zr—Te—Ox | Al—Ox |
| Experimental Example 7-7 | 15 | W—Hf—Te—Ox | Al—Ox |
| Experimental Example 7-8 | 17 | Ta—Hf—Te—Ox | Al—Ox |
| Experimental Example 7-9 | 15 | Hf—Te—Ox—Nx | Al—Ox |
| Experimental Example 7-10 | 19 | Zr—Al—Cu—Te | Al—Ox |

As can be seen from Table 8, even though the configuration of the ion source layer 21 was the same, in the samples (experimental Examples 7-1 to 7-5) in which B was used as the material of the resistance change layer 22, the retainable minimum current value was lower than that in the samples (Experimental Examples 7-6 to 7-10) in which Al was used. In other words, it is found that the retention performance of the intermediate resistance value is improved by including B in the resistance change layer 22 irrespective of the configuration of the ion source layer 21. Moreover, as can be seen from a comparison between Experimental Examples 7-1 to 7-5 and Experimental Examples 7-6 to 7-10, even though the configuration of the resistance change layer 22 was the same, the retainable minimum current value differs depending on which material is used for the ion source layer 21. In particular, it is found that Experimental Examples 7-1 to 7-4 in which the transition metal elements included in the Groups 4, 5, and 6 of the periodic table were used for the ion source layer 21 had higher retention performance at a low current than Experimental Example 7-5 in which Cu or Al was used for the ion source layer 21. In other words, it is considered that the ion source layer 21 in the present disclosure may preferably use at least the chalcogen element such as Te and one or more kinds of transition metal elements included in the Groups 4 to 6 of the periodic table. Moreover, it is found that O or N may be preferably included.

(Experiment 8)

Respective samples (Experimental Examples 8-1 to 8-3) were fabricated with use of the following method. First, after the lower electrode 10, made of TiN, in which a transistor was embedded in a base was cleaned by reverse sputtering, a film of Hf was formed with a thickness of 1 nm, and the film of Hf was oxidized by oxygen plasma to form HfOx, thereby forming a film of HfOX as the resistance change layer 72. Next, for the ion source layer 71, reactive sputtering was performed using 50% of Hf and 50% of Te in an atomic % ratio in an argon (Ar) process gas mixed with oxygen at a flow ratio of, for example, argon (sccm)/oxygen (sccm)=75/5. Accordingly, an HfTe—Ox film was formed with a film thickness of 45 nm Next, W with a thickness of 30 nm was formed to form the upper electrode 30. Finally, heat treatment was performed for 2 hours at 320° C., and then patterning was performed to fabricate the storage device 1 (Experimental Examples 8-1 to 8-3). The compositions of the respective samples are described below order of "lower electrode/resistance change layer/ion source layer/upper electrode". Moreover, as film thicknesses of the respective layers in respective samples, the film thickness of the ion source layer 21 was 45 nm, and the film thickness of the upper electrode 30 was 30 nm. It is to be noted that Experimental Example 1-3, Experimental Example 5-1, and Experimental Example 7-10 fabricated in the above-described Experiments 1, 5, and 7 are used as an example (Experimental Example 5-1) and comparative examples (Experimental Examples 1-3 and 7-10) of this experiment. Table 9 is a listing of electronic polarizability (hereinafter simply referred to as "polarizability") of chalcogen elements.

(Experimental Example 8-1) TiN/Hf—Ox/Hf50Te50-Ox/W
(Experimental Example 8-2) TiN/Hf—Ox/Hf50Te50/W
(Experimental Example 8-3) TiN/Hf—Ox/Hf/W
(Experimental Example 7-10) TiN/Al—Ox/Zr—Al—Cu—Te/W
(Experimental Example 5-1) TiN/B—Ox/Hf—O/Hf50Te50-Ox/W
(Experimental Example 1-3) TiN/Al—Ox/Hf50Te50-Ox/W

TABLE 9

| Ion | Electronic Polarizability ($10^{-24}$ · cm) |
|---|---|
| $O^{2-}$ | 2.4 |
| $S^{2-}$ | 5.5 |
| $Se^{2-}$ | 7 |
| $Te^{2-}$ | 9 |

Respective memory arrays (each having 60 bits) configured of the above-described samples (Experimental Examples 8-1 to 8-3, 7-10, 5-1, 1-3) were fabricated, and a writing operation was performed. More specifically, under a writing voltage of 3.8 V, and a writing current set to 10 μA (a low current) by adjusting a gate voltage of a MOS transistor, writing in an intermediate level was performed. FIGS. 9(A) to (F) are plots obtained by reading, 10000 times, the resistance value (the intermediate resistance value) in writing in the intermediate level of the respective experimental examples.

The following is found from FIGS. 9(A) to (F). First, in the samples (Experimental Examples 8-1, 8-2, and 5-1) in which Hf was used for the resistance change layer 72 (or 82A) and the ion source layer 71 (or 81), and Te was also used for the ion source layer 72 (or 82A), variation in resistance value in reading was small. In other words, random telegraph noise was reduced. It is considered that this is because an oxygen defect formed in the resistance change layer 72 (or 82A) was stabilized by bonding Hf in the resistance change layer 72 (or 82A) to oxygen with high electronegativity. Moreover, Hf in the ion source layer 71 (or 81) was bonded to Te, or was ionized together with Te with large polarizability to come into charge balance with Te. Further, as described above, since Te has large polarizability, an ion state thereof is easily retained. Therefore, it is considered that, even if local charge deviation caused by formation of an oxygen defect in the resistance change layer 72 (or 82A) occurs, the state of the oxygen defect is retained as it is. Furthermore, it was found that variation in resistance value in reading was further reduced by including O in the ion source layer 71 (or 81).

On the other hand, in the samples (Experimental Examples 7-10 and 1-3) in which Hf was not included in the resistance change layer 72, variation in resistance value was large every time reading was performed (FIG. 9(D) and FIG. 9(F)). It is considered that this is because in Experimental Examples 7-10 and 1-3, instead of Hf, Al was used for the resistance change layer 72. Al has low resistance in the form of a simple element, and as described above, Al has high mobility by voltage application. Therefore, Al is easily diffused in the ion source layer 71, and Al moves more easily in a matrix including a chalcogen element such as Te. Therefore, it is guessed that local charge deviation such as an oxygen defect formed in writing was influenced to cause large variation in resistance value every time reading was performed. Therefore, it is found that it may not preferable to use Al for the resistance change layer 72 (or 82A). It is to be noted that, although not illustrated here, Cu may not be preferable as well as the material of the resistance change layer 72 (or 82A), because Cu has high mobility by voltage application.

Moreover, in the sample (Experimental Example 8-3) in which Hf was used for the resistance change layer 72, variation in resistance value was large every time reading was performed. It is considered that this is because there was no layer including an element, such as Te, having large polarizability and being capable of absorbing charge deviation on the resistance change layer 72 in which an oxygen defect associated with charge deviation was formed. Therefore, it is considered that, in the resistance change layer 72, generation and disappearance of the oxygen defect influenced by local charge unbalance around the oxygen defect in reading or time change in reading, i.e., disconnection and reconnection of the conductive path occurred, and they were observed as noise illustrated in FIG. 9(C).

Thus, it was found that random telegraph noise was reduced by using the chalcogen element (Te in this case) with a high relative dielectric constant (polarizability) for the ion source layer 71 (or 81) and using the transition metal element such as Hf for the ion source layer 71 (or 81) and the resistance change layer 72 (82A).

It is to be noted that it is considered that an effect of further reducing random telegraph noise is obtained by using a same metal element as transition metal elements used for the ion source layer 71 (or 81) and the resistance change layer 72 (or 82A). If different metal elements are used for the ion source layer 71 (or 81) and the resistance change layer 72 (or 82A), ease of oxidation is different between the metal elements due to a difference in ionization tendency. More specifically, the metal element with a large ionization tendency is oxidized first. Moreover, an element that is more likely to be oxidized may take oxygen from an element that is less likely to be oxidized. Therefore, it may be difficult to retain the intermediate resistance value by formation of the oxygen defect. Accordingly, as the metal elements used for the ion source layer 71 (or 81) and the resistance change layer 72 (or 82A), metal elements of a same kind, i.e., metal elements in a same group may be preferably used, and a same element may be more preferably used, thereby allowing random telegraph noise to be further reduced.

Although the present disclosure is described referring to the first and second embodiments, Modification Examples 1 and 2, and the examples, the present disclosure is not limited thereto, and various modifications are possible.

For example, in the above-described embodiments and the like, the configurations of the storage devices 1 and 3 to 5 and the memory cell array 2 are described in detail; however, it is not necessary to include all layers, or on the contrary, any other layer may be further included. Moreover, the material of each layer, the method and conditions of forming each layer are not limited to those described in the above-described embodiments and the like, and each layer may be made of any other material, or may be formed by any other method. For example, an element other than the above-described elements may be used for the ion source layer 21 as long as the above-described composition ratio or demand characteristics for the multi-value memory are not impaired.

Further, the storage devices 1 and 3 to 5 of the above-described embodiments and the like may have a inverted configuration in which the ion source layer 21 and the resistance change layer 22 change their places vertically, or to increase memory capacity, the storage devices 1 and 3 to 5 may have a cross-point configuration/system combined with an appropriate diode or memory devices may be laminated in a vertical direction, and thus, the storage devices 1 and 3 to 5 are applicable to memory configurations of various existing types.

It is to be noted that the present technology is allowed to have following configurations.

(1) A storage device provided with a first electrode, a storage layer, and a second electrode, the first electrode, the storage layer, and the second electrode being provided in this order, the storage layer including:

an ion source layer including one or more kinds of chalcogen elements selected from tellurium (Te), sulfur (S), and selenium (Se), and one or more kinds of transition metal elements selected from Group 4 elements, Group 5 elements, and Group 6 elements of the periodic table; and a resistance change layer including boron (B) and oxygen (O).

(2) The storage device according to (1), in which a part or a whole of boron (B) included in the resistance change layer is bonded to oxygen (O).

(3) The storage device according to (1) or (2), in which the resistance change layer includes, as an additive element, one or more kinds selected from tungsten (W), hafnium (Hf), carbon (C), silicon (Si), tantalum (Ta), magnesium (Mg), copper (Cu), nickel (Ni), zirconium (Zr), and gadolinium (Gd).

(4) The storage device according to (3), in which the content (a composition ratio of B/a total composition ratio of B and the additive element) of boron (B) included in the resistance change layer is 30% or more.

(5) The storage device according to (3) or (4), in which the resistance change layer has a laminate configuration including a first resistance change layer and a second resistance change layer, the first resistance change layer including boron (B), and the second resistance change layer including one or more kinds of the additive elements in the form of oxide or nitride.

(6) The storage device according to (5), in which the first resistance change layer includes oxygen (O).

(7) The storage device according to (5) or (6), in which the first resistance change layer and the second resistance change layer are laminated in this order from the first electrode side.

(8) The storage device according to (5) or (6), in which the second resistance change layer and the first resistance change layer are laminated in this order from the first electrode side.

(9) The storage device according to any one of (1) to (8), in which the ion source layer includes oxygen (O) or nitrogen (N).

(10) The storage device according to any one of (1) to (9), in which a resistance value is changed by forming a low resistance section including the transition metal element or an oxygen defect in the resistance change layer by voltage application to the first electrode and the second electrode.

(11) A storage device provided with a first electrode, a storage layer, and a second electrode, the first electrode, the storage layer, and the second electrode being provided in this order, the storage layer including:
an ion source layer including one or more kinds of chalcogen elements selected from tellurium (Te), sulfur (S), and selenium (Se), and one or more kinds of transition metal elements selected from Group 4 elements, Group 5 elements, and Group 6 elements of the periodic table; and
a resistance change layer including one or more kinds of transaction metal elements selected from Group 4 elements, Group 5 elements, and Group 6 elements of the periodic table, and oxygen (O).

(12) The storage device according to (11), in which the resistance change layer has a laminate configuration including a first resistance change layer and a second resistance change layer, the first resistance change layer including boron (B) and oxygen (O), and the second resistance change layer including one or more kinds of additive elements in the form of oxide or nitride.

(13) The storage device according to (12), in which the first resistance change layer, the second resistance change layer, and the ion source layer are laminated in this order from the first electrode.

(14) The storage device according to (12) or (13), in which the first resistance change layer includes carbon (C).

(15) The storage device according to any one of (11) to (14), in which the ion source layer includes hafnium (Hf) as the transition metal element.

(16) The storage device according to any one of (11) to (15), in which a resistance value is changed by forming a low resistance section including the transition metal element or an oxygen defect in the resistance change layer by voltage application to the first electrode and the second electrode.

(17) A storage unit provided with a plurality of storage device and a pulse application means, each of the storage devices including a first electrode, a storage layer, and a second electrode in this order, the pulse application means configured to selectively apply a pulse of a voltage or a current to the plurality of storage devices, the storage layer including:
an ion source layer including one or more kinds of chalcogen element selected from tellurium (Te), sulfur (S), and selenium (Se), and one or more kinds of transition metal elements selected from the Groups 4, 5, and 6 of the periodic table, and a resistance change layer including boron (B) and oxygen (O).

(18) A storage unit provided with a plurality of storage device and a pulse application means, each of the storage devices including a first electrode, a storage layer, and a second electrode in this order, the pulse application means configured to selectively apply a pulse of a voltage or a current to the plurality of storage devices, the storage layer including:
an ion source layer including one or more kinds of chalcogen element selected from tellurium (Te), sulfur (S), and selenium (Se), and one or more kinds of transition metal elements selected from the Groups 4, 5, and 6 of the periodic table; and
a resistance change layer including one or more kinds of transaction metal elements selected from the Groups 4, 5, and 6 of the periodic table, and oxygen (O).

The present application claims priority on the basis of Japanese Patent Application No. 2012-2641685 filed in the Japan Patent Office on Dec. 3, 2012 and Japanese Patent Application No. 2013-141685 filed in the Japan Patent Office on Jul. 5, 2013, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A storage device, comprising:
a first electrode;
a second electrode; and
a storage layer, wherein the first electrode, the storage layer, and the second electrode are laminated in an order,
wherein the storage layer comprises:
an ion source layer including at least one kind of chalcogen element selected from tellurium (Te), sulfur (S), or selenium (Se), and at least one kind of transition metal element selected from Group 4 elements, Group 5 elements, or Group 6 elements of the periodic table; and
a resistance change layer that has a laminate configuration, wherein the laminate configuration includes a first resistance change layer and a second resistance change layer, including boron (B) and oxygen (0) and wherein the first resistance change layer includes boron (B), and the second resistance change layer includes at least one kind of an additive element in a form of an oxide or a nitride.

2. The storage device according to claim 1, wherein a part or a whole of boron (B) included in the resistance change layer is bonded to oxygen (O).

3. The storage device according to claim 1, wherein the resistance change layer further includes, as the additive element, at least one kind selected from tungsten (W), hafnium (Hf), carbon (C), silicon (Si), tantalum (Ta), magnesium (Mg), copper (Cu), nickel (Ni), zirconium (Zr), or gadolinium (Gd).

4. The storage device according to claim 3, wherein a composition ratio of B/a total composition ratio of B and the additive element of boron (B) included in the resistance change layer is 30% or more.

5. The storage device according to claim 1, wherein the first resistance change layer further includes oxygen (O).

6. The storage device according to claim 1, wherein the first resistance change layer and the second resistance change layer are laminated in order from a side of the first electrode.

7. The storage device according to claim 1, wherein the second resistance change layer and the first resistance change layer are laminated in order from a side of the first electrode.

8. The storage device according to claim 1, wherein the ion source layer includes oxygen (O) or nitrogen (N).

9. The storage device according to claim 1, wherein a resistance value of the resistance change layer changes based on a formation of a low resistance section that includes at least one of the transition metal element or an oxygen defect in the resistance change layer by voltage application to the first electrode and the second electrode.

10. A storage device, comprising:
a first electrode;
a second electrode; and
a storage layer, wherein the first electrode, the storage layer, and the second electrode are laminated in an order,
wherein the storage layer comprises:
an ion source layer including at least one kind of chalcogen element selected from tellurium (Te), sulfur (S), or selenium (Se), and at least one kind of transition metal element selected from Group 4 elements, Group 5 elements, or Group 6 elements of the periodic table; and
a resistance change layer that has a laminate configuration, wherein the laminate configuration includes a first resistance change layer and a second resistance change layer, wherein the resistance change layer includes at least one kind of the transaction metal element selected from Group 4 elements, Group 5 elements, or Group 6 elements of the periodic table, and oxygen (O), and
wherein the first resistance change layer includes boron (B) and oxygen (O), and the second resistance change layer includes at least one kind of an additive element in a form of an oxide or a nitride.

11. The storage device according to claim 10, wherein the first resistance change layer, the second resistance change layer, and the ion source layer are laminated in order from a side of the first electrode.

12. The storage device according to claim 10, wherein the first resistance change layer includes carbon (C).

13. The storage device according to claim 10, wherein the ion source layer includes hafnium (Hf) as the transition metal element.

14. The storage device according to claim 10, wherein a resistance value of the resistance change layer changes based on a formation a low resistance section that includes at least one of the transition metal element or an oxygen defect in the resistance change layer by voltage application to the first electrode and the second electrode.

15. The storage device according to claim 10, wherein the ion source layer includes oxygen (O) or nitrogen (N).

16. A storage unit, comprising:
a plurality of storage devices and a pulse application means, each of the plurality of storage devices including a first electrode, a storage layer, and a second electrode in an order, the pulse application means configured to selectively apply a pulse of a voltage or a current to the plurality of storage devices, the storage layer comprising:
an ion source layer including at least one kind of chalcogen element selected from tellurium (Te), sulfur (S), or selenium (Se), and at least one kind of transition metal element selected from Group 4 elements, Group 5 elements, or Group 6 elements of the periodic table; and
a resistance change layer that has a laminate configuration, wherein the laminate configuration a first resistance change layer and a resistance change layer, and wherein the first resistance change layer includes boron (B), and the second resistance change layer includes at least one kind of an additive element in a form of an oxide or a nitride.

17. A storage unit, comprising:
a plurality of storage device and a pulse application means, each of the plurality of storage devices including a first electrode, a storage layer, and a second electrode in an order, the pulse application means configured to selectively apply a pulse of a voltage or a current to the plurality of storage devices, the storage layer comprising:
an ion source layer including at least one kind of chalcogen element selected from tellurium (Te), sulfur (S), or selenium (Se), and at least one kind of transition metal element selected from Group 4 elements, Group 5 elements, or Group 6 elements of the periodic table; and
a resistance change layer that has a laminate configuration, wherein the laminate configuration includes a first resistance change layer and a second resistance change layer, wherein the resistance change layer includes at least one kind of transition metal element selected from Group 4 elements, Group 5 elements, or Group 6 elements of the periodic table, and oxygen (O), and
wherein the first resistance change layer includes boron (B) and oxygen (O), and the second resistance change layer includes at least one kind of an additive element in a form of an oxide or a nitride.

* * * * *